United States Patent
Ptasienski et al.

(10) Patent No.: US 11,343,879 B2
(45) Date of Patent: May 24, 2022

(54) MULTI-ZONE PEDESTAL HEATER WITHOUT VIAS

(71) Applicant: Watlow Electric Manufacturing Company, St. Louis, MO (US)

(72) Inventors: Kevin Ptasienski, Winona, MN (US); Stanton Hopkins Breitlow, Winona, MN (US); Mohammad Nosrati, Redwood City, CA (US); Kevin Smith, Columbia, MO (US); Brittany Phillips, Saint Louis, MO (US); Ken Ames, San Jose, CA (US); Patrick Margavio, Columbia, MO (US); Kurt English, Columbia, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 570 days.

(21) Appl. No.: 16/196,820

(22) Filed: Nov. 20, 2018

(65) Prior Publication Data
US 2019/0153598 A1    May 23, 2019

Related U.S. Application Data

(60) Provisional application No. 62/589,023, filed on Nov. 21, 2017.

(51) Int. Cl.
*H05B 3/28*    (2006.01)
*H05B 3/06*    (2006.01)
(Continued)

(52) U.S. Cl.
CPC ........... *H05B 3/06* (2013.01); *C23C 16/4586* (2013.01); *H01L 21/67103* (2013.01); *H01L 21/67109* (2013.01); *H01L 21/67248* (2013.01); *H01L 21/68735* (2013.01); *H01L 21/68757* (2013.01); *H01L 23/485* (2013.01); *H01L 23/522* (2013.01); *H05B 1/0202* (2013.01); *H05B 1/0233* (2013.01); *H05B 3/28* (2013.01);
(Continued)

(58) Field of Classification Search
None
See application file for complete search history.

(56) References Cited

U.S. PATENT DOCUMENTS 7,279,661 B2    10/2007  Okajima et al.
8,546,732 B2 *  10/2013  Singh .................. H01L 21/6831
                                                          219/486
(Continued)

FOREIGN PATENT DOCUMENTS

WO    2017074838    5/2017
WO    2017100304    6/2017

OTHER PUBLICATIONS

International Search Report for International application PCT/US2018/062055, dated Feb. 14, 2019.

*Primary Examiner* — Joseph M. Pelham
(74) *Attorney, Agent, or Firm* — Burris Law, PLLC

(57) ABSTRACT

A support pedestal is provided that includes a substrate having a top resistive layer defining a first set of zones and a bottom resistive layer defining a second set of zones. Each zone of the first and second set of zones is coupled to at least two electric terminals from among a plurality of electric terminals, and a total number of electric terminals is less than or equal to a total of the first and second set of zones.

14 Claims, 7 Drawing Sheets

(51) Int. Cl.

| | |
|---|---|
| *H01L 23/48* | (2006.01) |
| *H01L 23/52* | (2006.01) |
| *F27B 5/14* | (2006.01) |
| *H05B 1/02* | (2006.01) |
| *H01L 21/67* | (2006.01) |
| *H01L 23/522* | (2006.01) |
| *H01L 23/485* | (2006.01) |
| *C23C 16/458* | (2006.01) |
| *H01L 21/687* | (2006.01) |

(52) U.S. Cl.
CPC .. *H05B 2203/005* (2013.01); *H05B 2203/007* (2013.01); *H05B 2203/014* (2013.01); *H05B 2203/016* (2013.01); *H05B 2203/035* (2013.01)

(56) References Cited

U.S. PATENT DOCUMENTS

| | | | |
|---|---|---|---|
| 8,680,441 B2 * | 3/2014 | Singh | B29D 7/01 |
| | | | 219/486 |
| 9,324,589 B2 * | 4/2016 | Pease | H05B 1/0233 |
| 9,472,434 B2 | 10/2016 | Cox | |
| 9,538,583 B2 | 1/2017 | Volfovski et al. | |
| 9,812,342 B2 * | 11/2017 | Swanson | H01L 21/67103 |
| 10,256,105 B2 | 4/2019 | Takebayashi et al. | |
| 10,340,162 B2 * | 7/2019 | Swanson | H01L 21/67248 |
| 10,568,163 B2 * | 2/2020 | Singh | H01L 21/67288 |
| 2001/0027972 A1 * | 10/2001 | Yamaguchi | H05B 1/0233 |
| | | | 219/468.1 |
| 2003/0075537 A1 * | 4/2003 | Okajima | H01L 21/67103 |
| | | | 219/444.1 |
| 2004/0188413 A1 | 9/2004 | Natsuhara et al. | |
| 2005/0109767 A1 | 5/2005 | Fennewald et al. | |
| 2011/0092072 A1 * | 4/2011 | Singh | H01L 21/6833 |
| | | | 438/710 |
| 2013/0068750 A1 * | 3/2013 | Gaff | H01L 21/6831 |
| | | | 219/444.1 |
| 2013/0270250 A1 * | 10/2013 | Pease | H05B 1/0233 |
| | | | 219/443.1 |
| 2017/0148657 A1 | 5/2017 | Pape | |
| 2018/0061682 A1 * | 3/2018 | Swanson | H01L 21/67103 |

\* cited by examiner

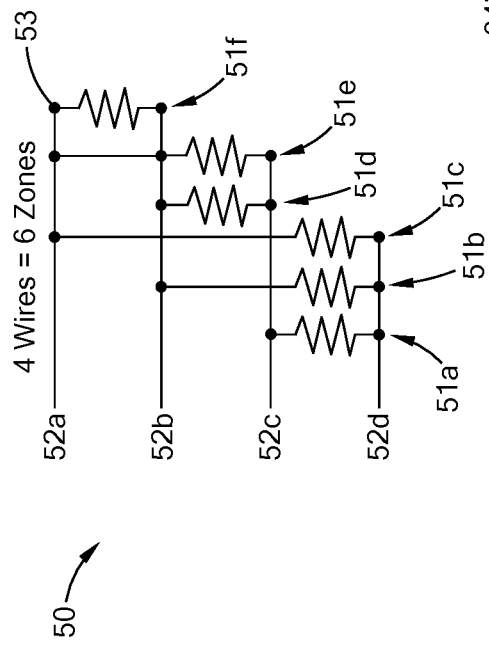
FIG. 3
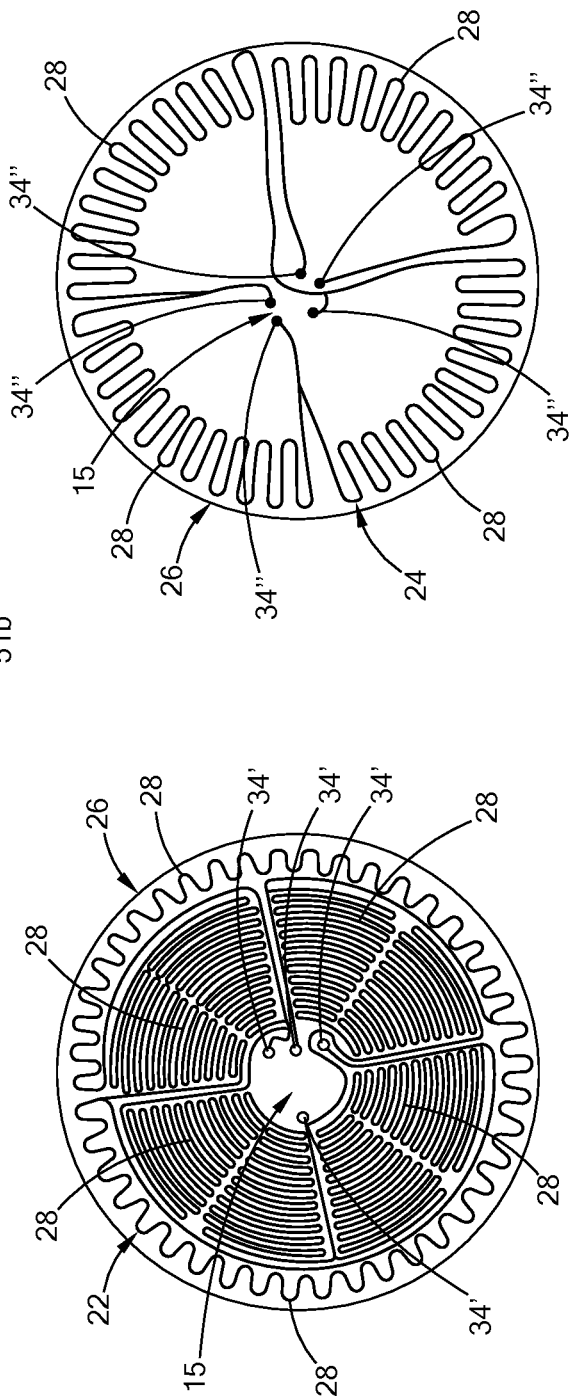
FIG. 5
FIG. 4

MULTI-ZONE PEDESTAL HEATER WITHOUT VIAS

CROSS-REFERENCE TO RELATED APPLICATIONS

This application claims priority to and the benefit of U.S. Provisional Application No. 62/589,023, titled "Multi-Zone Ceramic Pedestal" filed Nov. 21, 2017, the contents of which are incorporated herein by reference in their entirety.

FIELD

The present disclosure relates generally to semiconductor processing apparatuses, and more particularly to substrate support pedestals for supporting and heating a substrate, such as a wafer, thereon.

BACKGROUND

The statements in this section merely provide background information related to the present disclosure and may not constitute prior art.

A wafer support assembly such as a pedestal for semiconductor processing is disposed in a semiconductor processing chamber and typically includes a wafer support portion and a shaft secured to a central region of the wafer support portion. The wafer support portion may include a resistive heating element for generating heat and electric terminations for connecting the resistive heating element to an external power source. The electric terminations are disposed adjacent to the central region of the wafer support portion and extend in the shaft. The resistive heating element is disposed outside the central region of the wafer support portion, and usually, at proximity of the center shaft area there are no resistive heating elements due to the presence of the electric terminations. As a result, a cold spot is typically generated in the central region, and the size of the central region is thus made relatively small in order to reduce the area of the cold spot.

The reduced size of the central region, however, limits the number of electric terminations that can be disposed in the central regions and consequently the number of the heating zones that can be independently controlled. Due to complexity of integrating temperature sensing devices in to a pedestal and cold region at proximity of shaft area, a conventional wafer support pedestal is generally configured to provide only one or two heating zones. With limited heating zones, a predetermined heating profile across the wafer support portion cannot be provided due to various factors that may be present in a semiconductor processing chamber to affect a local temperature of the wafer support portion.

Moreover, the reduced size of the central region also limits the number of temperature sensors that can be used to monitor the temperature of the wafer support portion. The limited number of temperature sensors does not allow for precise monitoring of the temperature of the wafer support portion. Therefore, the resistive heating element of the wafer support portion is typically operated using ratio control (i.e., open loop).

SUMMARY

In one form, the present disclosure provides a support pedestal that includes a substrate having a top resistive layer defining a first set of zones and a bottom resistive layer defining a second set of zones. Each zone of the first and second set of zones are on different planes and are coupled to at least two electric terminals from among a plurality of electric terminals, and a total number of electric terminals is less than or equal to a total of the first and second set of zones.

In one variation, at least two electric terminals from among the plurality of electric terminals are disposed at a central region of at least one of the top and bottom resistive layers. The plurality of electric terminals may be in the form of termination pads.

In another variation, at least two zones among the at least one of the first set of zones and the second set of zones are connected to the same electric terminal among the plurality of electric terminals.

In another variation, the support pedestal does not include vias and/or any routing layers.

In still another variation, at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

In yet another variation, the support pedestal further comprises a control system including a plurality of power converters for adjusting power to each zone of the first and second set of zones of the top and bottom resistive layers.

In another form, a support pedestal is provided that includes a substrate having a first surface and a second surface opposite the first surface, a top resistive layer disposed on the first surface of the substrate, and a bottom resistive layer disposed on the second surface of the substrate. The top and bottom resistive layers each define a first set of zones and a second set of zones, respectively. Each zone of the first and second set of zones is coupled to at least two electric terminals from among a plurality of electric terminals, and the number of electric terminals is less than or equal to a number of the first and second set of zones.

In one variation, the support pedestal does not include vias and/or any routing layers.

In another variation, at least two zones among the at least one of the first set of zones and the second set of zones are connected to the same electric terminal among the plurality of electric terminals.

In still another variation, at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

In yet another variation, the support pedestal further comprises a control system including a plurality of power converters for adjusting power to each zone of the first and second set of zones of the top and bottom resistive layers.

In another variation, at least two electric terminals from among the plurality of electric terminals are disposed at a central region of at least one of the top and bottom resistive layers.

In yet another form, a support member is provided that includes a top resistive layer having at least two zones, and a bottom resistive layer disposed in a different plane than that of the top resistive layer, the bottom resistive layer having at least two zones. A main substrate is disposed between the top and bottom resistive layer. At least two electric terminals from among a plurality of electric terminals are disposed on the same plane as at least one of the top resistive layer and the bottom resistive layer, and each zone of the top and bottom resistive layer is coupled to at least two electric terminals from among the plurality of electric terminals and a number of electric terminals is less than or equal to a total number of zones of the top and bottom resistive layer.

In one variation, the support pedestal does not include vias and/or any routing layers.

In another variation, at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein:

FIG. 3 illustrates a six-zone heater with four termination wires in accordance with the teachings of the present disclosure;

FIG. 4 illustrates a six-zone upper resistive heating layer with the ends of the zones connected at a center of a substrate in accordance with the teachings of the present disclosure;

FIG. 5 illustrates a four-zone bottom resistive heating layer with the ends of the zones connected at a center of a substrate in accordance with the teachings of the present disclosure;

Corresponding reference numerals indicate corresponding parts throughout the several views of the drawings.

DETAILED DESCRIPTION

The following description is merely exemplary in nature and is not intended to limit the present disclosure, application, or uses.

Figure 1:
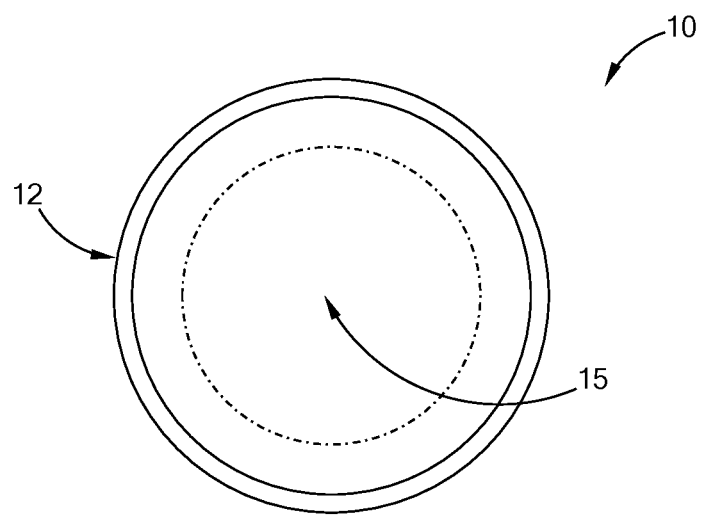
FIG. 1 is a top view of a support pedestal constructed in accordance with teachings of the present disclosure.
Figure 2:
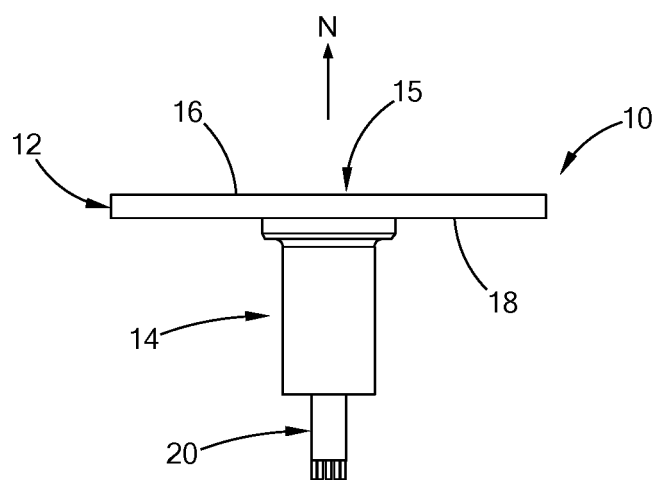
FIG. 2 is a side view of the support pedestal of FIG. 1.

Referring to FIGS. 1 to 2, a multi-zone heater pedestal 10 constructed in accordance with the teachings of the present disclosure may be used in a semiconductor processing chamber for supporting and heating a heating target, such as a wafer, thereon. The multi-zone pedestal 10 includes a support member 12 and a tubular shaft 14 attached to a central region 15 of the support member 12. The support member 12 includes a top surface 16 for supporting a substrate, such as a wafer (not shown) thereon, and a bottom surface 18 to which the tubular shaft 14 is attached. The multi-zone pedestal 10 further includes a plurality of electric cables 20 received in the tubular shaft 14 for connecting to at least one electric element/layer embedded in the support member 12 and to an external power source. The electric layer may be a resistive heating layer, a temperature sensor, an electrode for an electrostatic chuck (ESC), or a Radio Frequency (RF) antenna, etc., depending on the application. While not shown in the drawings, the support member 12 may optionally define a gas conduit for receiving a purge gas and a vacuum conduit to provide vacuum clamping for the wafer.

When integrating more than two heaters on different layers, a routing layer and vias are typically used to interconnect and terminate the heater circuits in the center/shaft area of the pedestal. However, the multi-zone heater pedestal 10 of the present disclosure utilizes a thermal array system that incorporates multiple heating zones with closed loop control without the use of vias or interconnects. The thermal array system merges heater designs with controls that incorporate power, resistance voltage, and current in a customizable feedback control system that limits any or all of these parameters while controlling another signal. Each zone of the thermal array system includes resistive heating elements that can also be used as temperatures sensors and are arranged as multi-parallel circuits, thus reducing the number of wires and complexity of the system, which is described in greater detail below. Additional information regarding such thermal array system has been disclosed in Applicant's U.S. Pat. No. 9,196,513, titled "System and Method for Controlling a Thermal Array," which is commonly owned with the present application and the contents of which are incorporated herein by reference in its entirety.

Referring to FIG. 3, a configuration of a six-zone heater 50 with four termination wires 52a, 52b, 52c, 52d, where each zone 51a, 51b, 51c, 51d, 51e, and 51f is represented as a resistor, is illustrated. As shown, a given zone 51a, 51b, 51c, 51d, 51e, 51f has at least one of its ends 53 connected to a wire 52a, 52b, 52c, 52d that is shared with another zone 51a, 51b, 51c, 51d, 51e, 51f. Using this configuration, the number of wires used for connecting to the ends 53 of a zone decreases from 12 to only 4. Furthermore, this configuration allows the six-zone heater 50 to be terminated in the central region in the same heater plane surface, thereby eliminating the need for a routing layer and/or vias.

Figures 6, 7:
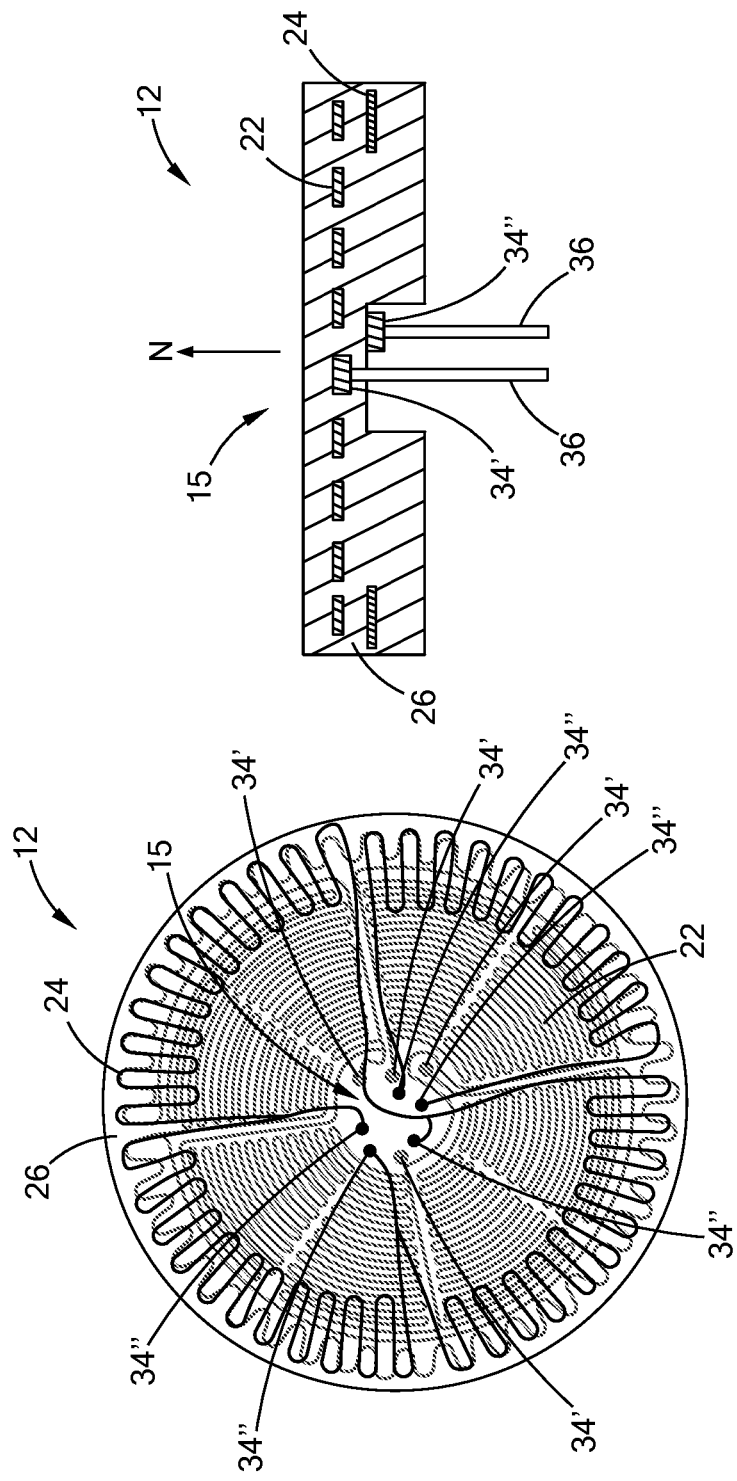
FIG. 6 illustrates a top view of the upper and lower resistive heating layers of FIGS. 4 and 5, respectively.
FIG. 7 illustrates the connection of wires to termination pads at the center of the substrate in accordance with the teachings of the present disclosure.

Referring to FIGS. 4 to 7, a multi-zone pedestal includes a top resistive heating layer 22, a main plate or substrate 26, a bottom resistive heating layer 24, and a plurality of electric terminals 34' in the form of termination pads. The substrate 26 in one form is a ceramic material. The top resistive heating layer 22 has six heating zones that are connected to four electric terminals 34', which are positioned at a center of the substrate 26. The bottom resistive heating layer 24 has four heating zones and five electric terminals 34" connected at the center of the substrate 26. FIG. 6 illustrates a top view of both top and bottom heating layers 22, 24 to illustrate the different zones and the connection at the center of the substrate 26.

The resistive material of the heater can be a high TCR coiled wires, foil, thick film or thin film materials, among others. In one form, the heaters are integrated into a mid-ceramic plate, which can be in green, partially or fully sintered state. This heater plate can be sealed by placing a blank on top and bottom and fully sintering by diffusion bonding or assisted hot press sintering. In one form, the center termination area is machined, and pins are connected or brazed into the electric terminations (FIG. 7). At some point, the center shaft is bounded or sintered into the ceramic plate assembly. A control system for operating and controlling the heater is integrated with the ceramic pedestal by way of the termination pins, which is described in greater detail below.

The multi-zone heater pedestal 10 improves the performance of the heater and simplifies the manufacturing process. Specifically, the multi-zone ceramic pedestal of the present disclosure: (1) eliminates the need for routing layers, and interconnects and vias for terminating the zones; (2) eliminates the need for separate sensing devices for each zone or heater since the resistive layer can also be used to determine temperature; (3) simplifies manufacturing with the removal of the routing layer and the vias; (4) enhances the performance of the ceramic pedestal by utilizing the closed loop algorithm of a thermal array system; (5) improves the reliability of the ceramic pedestal since the need for routing layers and interconnect are eliminated; (6) increases the life time expectancy of the ceramic pedestal; and (7) reduces the cost of the pedestal.

Accordingly, the top resistive layer 22 and the bottom resistive layer 24 each include a plurality of resistive heating elements 28 that are independently controllable and that define a plurality of heating zones. It should be understood that any number of the resistive heating elements 28/zones can be employed without departing from the scope of the present disclosure. Further, various construction techniques and pedestal configurations disclosed in copending application titled "MULTI-ZONE PEDESTAL HEATER HAVING A ROUTING LAYER" filed concurrently herewith and commonly assigned with the present application may be incorporated while remaining within the scope of the present disclosure.

It should be understood that the multi-zone pedestal is not limited to this specific structure disclosed herein with top and bottom resistive layers 22/24 and additional layers (e.g. functional layers such as bonding layer, dielectric layer, sensing layer, and protective layer, among others), in addition to multiple resistive layers greater than two (2), may be employed while still remaining within the scope of the present disclosure. In one example, the support member 12 further comprises an integrated radio frequency (RF) grid layer, which is electrically connected to a ground terminal to compensate for RF plasma or magnetic fields imposed by processing chamber. Alternatively, the top and/or bottom resistive layer 22, 24 is an RF grid layer. Generally, the RF grid layer is used as antenna to direct RF plasma or magnetic fields imposed by the processing chamber through ground terminal and shield and protect heater and sensor devices.

Figure 8:
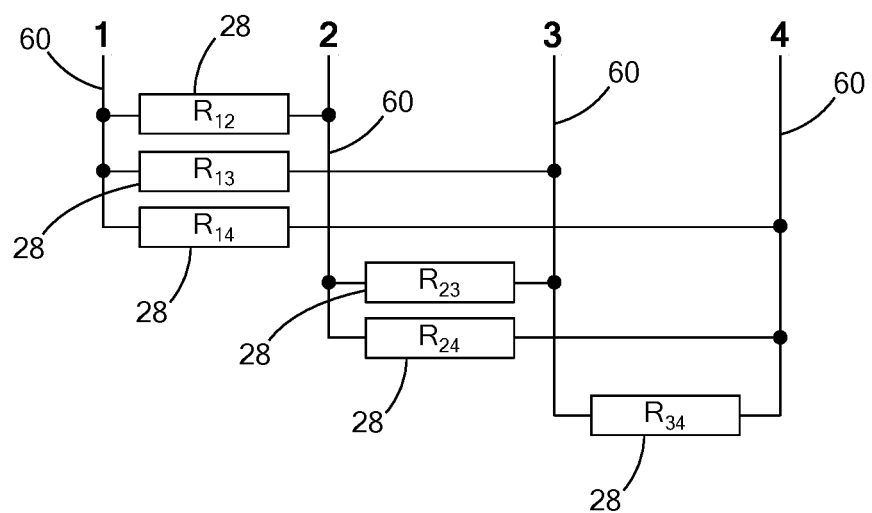
FIG. 8 is a schematic diagram of a wiring structure for controlling the resistive layer of the support pedestal of FIGS. 1 and 2.

Referring now to FIG. 8, a control system for controlling the upper and bottom resistive layers 22, 24 having multiple heating zones is described. The support member 12 can be connected to a control system using a closed loop control by using Adaptive Thermal System (ATS) technology to control the heating zones without additional sensors. The adaptive thermal system combines the heater design with a control system to deliver differentiated closed loop control while simplifying system integration. The resistive heating elements 28 of the upper and bottom resistive layers 22, 24 include a material that has relatively high temperature coefficient of resistance (TCR), such as molybdenum, titanium, nickel, such that each of the upper and bottom resistive layers 22, 24 can also be used as a sensor to provide temperature information based on resistance change of the resistive heating circuits.

In other words, the temperature of the resistive heating elements 28 is inferred via the resistance change of the resistive heating element 28 having relatively high temperature coefficient of resistance. Therefore, no additional temperature sensors, such as thermocouples, are needed, thereby simplifying the wiring connection in the support pedestal 10. Using resistive heating elements 28 rather than thermocouples can provide better temperature feedback and closed loop control on multiple heating zones to reduce ceramic breakage risk at higher temperatures. Various forms of this "two-wire" configuration is described in greater detail below.

In addition, matrix and multi-parallel wiring topologies are integrated with custom control algorithms. As shown in FIG. 8, the resistive heating elements 28 and the wirings for connecting the resistive heating elements 28 to an external power source are arranged such that every pair of wires 60 has a resistive heating element 28 connected between them. Such wiring arrangement has been described in Applicant's U.S. Pat. No. 9,123,755 titled, "System and Method for Controlling a Thermal Array," and its related patents/applications, which are commonly assigned with the present application and the contents of which are incorporated herein by reference in their entirety. The wiring arrangement allows for simultaneous power control and temperature sensing of all the resistive heating elements 28 to protect the ceramic materials of the support member 12 from breakage when a temperature at certain areas of the support member 12 becomes too high and exceeds a threshold temperature. In addition, the control scheme allows the use of fewer wirings with better control to achieve better thermal performance of the multi-zone pedestal 10. For example, in one form, the number of heaters that can be connected using the wiring topologies described herein is equal to $n(n-1)/2$, where n is the number of wires. Accordingly, the number of heaters/zones is generally greater than or equal to the number of wires 60.

In one form of the present disclosure, the resistive heating elements 28 of at least one of the top resistive layer 22 and the bottom resistive layer 24 are used for generating heat and for detecting temperature of the element. In other words, the resistive heating elements 28 are "two-wire" heating elements such that they function as heaters and as temperature sensors with only two leads wires operatively connected to the heating element rather than four (e.g., two for the heating element and two for a discrete temperature sensor). Such a two-wire capability is disclosed for example in U.S. Pat. No. 7,196,295, which is commonly assigned with the present application and incorporated herein by reference in its entirety.

Generally, the control system, which is in communication with the first and second lead wires, is configured to measure changes in voltage between the two lead wires. More specifically, the control system measures millivolt (mV) changes across the lead wires and then uses these changes in voltage to calculate an average temperature of the resistive heating element 28. In one form, the control system may measure changes in voltage without interrupting power to the resistive heating element 28. This may be accomplished, for example, by taking a reading at the zero crossing of an AC input power signal. In another form, power is interrupted and the control system switches from a heating mode to a measuring mode to measure the changes in voltage. Once the average temperature is determined, the control system switches back to the heating mode.

Different heating elements 28 of the upper and/or bottom resistive layer 22, 24 may not be heated at the same rate even though the same power supply is applied to the heating elements 28. This may be caused by various factors, such as positions of the heating elements 28 relative to heat sinks and the manufacturing non-uniformity in the heating zones. When a significant temperature difference occurs between adjacent heating zones, an induced thermomechanical stress due to significant difference in thermal expansion in the adjacent heating zones may result in cracks in the ceramic substrate of the heating plate. To address this concern, in one form of the present disclosure, the control system includes a power conversion system having one or more power converters for adjusting the power applied to the resistive layer.

Figure 9:
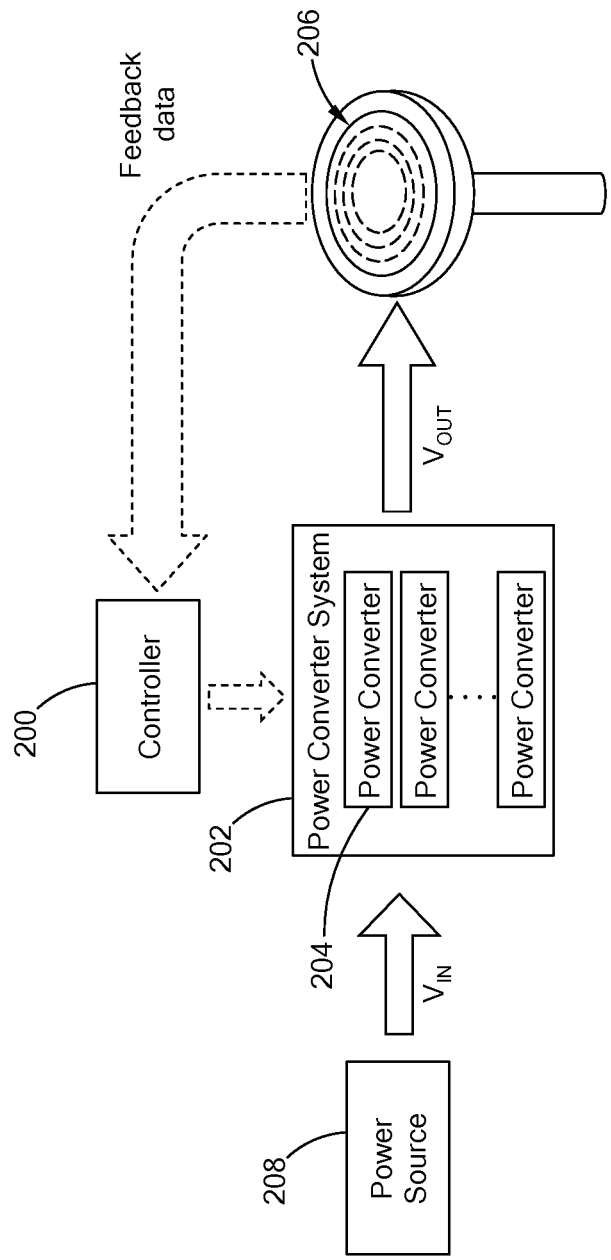
FIG. 9 is a block diagram of a control system having a power converter system in accordance with the teaching of the present disclosure.

Referring to FIG. 9, the control system includes a controller 200 and a power converter system 202 that includes a plurality of power converters 204. One or more power converters 204 are connected to heating elements of a resistive layer of a support pedestal 206. Each power converter 204 is operable to adjust an input voltage (VIN) from the power source 208 to an output voltage ($V_{OUT}$) that is applied to the heating elements, where the output voltage is less than or equal to the input voltage.

Figure 10:
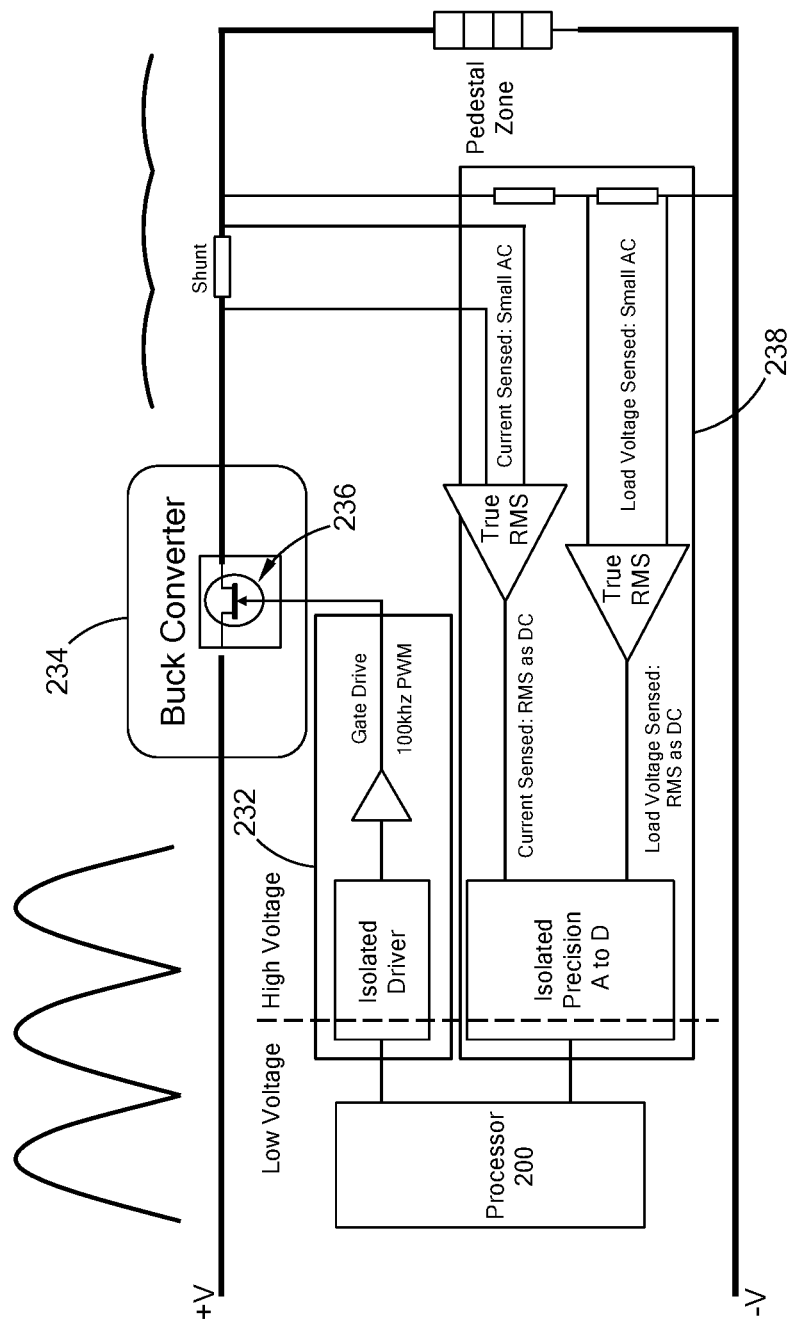
FIG. 10 is a block diagram of a power converter of the power converter system in accordance with the teaching of the present disclosure.
Figure 11C:
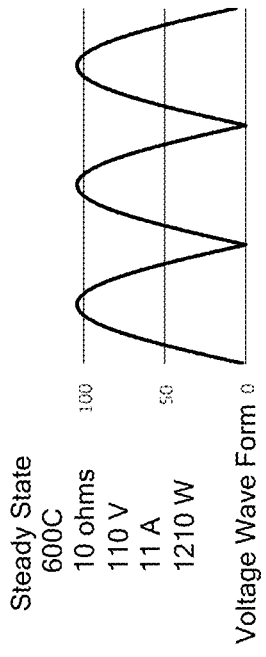
FIGS. 11A, 11B, 11C, and 11D illustrate waveforms of different output voltages of the power converter based on different input conditions in accordance with the teachings of the present disclosure.
Figure 11D:
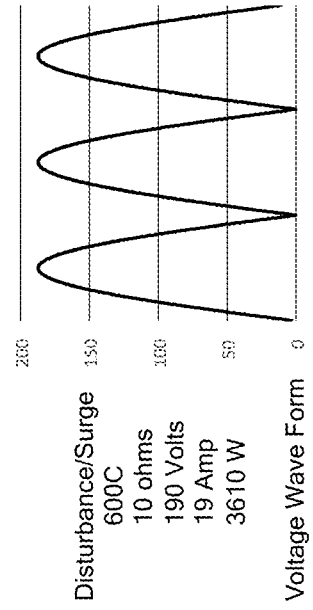
Figure 11A:
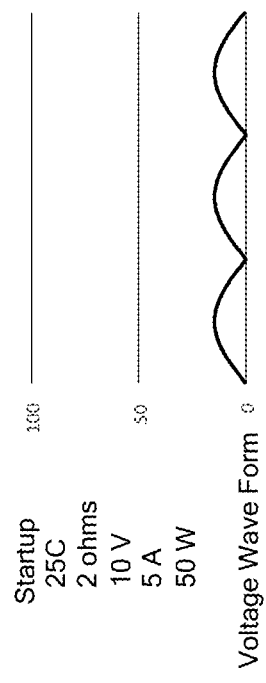
Figure 11B:
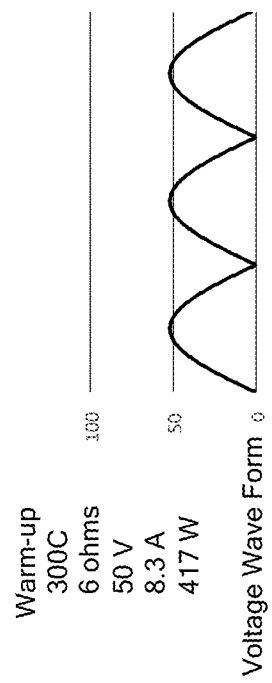

Referring to FIG. 10, a given power converter 204 includes a driver circuit 232 and a buck converter 234 having a control switch 236 that is a field effect transistor. The driver circuit 232 operates the control switch 236 based on an input signal from the controller 200.

Generally, the buck converter 234, as a step-down voltage converter, is operable to decrease the voltage from the power source 208. Specifically, the AC voltage from the power source 208 (e.g., 208 VAC) is rectified to a DC voltage that is then received by the buck converter 234. Based on the operation of the control switch 236, the buck converter 234 decreases the voltage and increases the current from the power source 208 and applies the adjusted voltage and current to respective heating elements. The conduction rate of the control switch controls the amplitude of the output voltage, such that a low conduction rate of the control switch outputs a low amplitude output voltage and a high conduction rate of the control switch outputs a high amplitude output voltage. To reduce voltage ripple, filters made of capacitors or a combination of capacitor and inductors are added to the output and/or the input of the buck converter 234. Additional information regarding the power conversion system has been disclosed in Applicant's co-pending application, U.S. Ser. No. 15/624,060, filed Jun. 15, 2017 and titled "Power Converter for a Thermal System" which is commonly owned with the present application and the contents of which are incorporated herein by reference in its entirety.

The controller 200 includes electronics including microprocessor and memory and is configured to control the power supplied to the resistive heating elements by the power converter system 202. The controller 200 operates the power converter system 202 to adjust the voltage applied to the heater elements based on feedback data from the heating elements of the pedestals and pre-stored control algorithms and/or processes. The feedback information includes at least one of resistance, load current, and/or voltage. The load current and/or voltage may be detected by a sensor circuit 238.

In one form of the present disclosure, an input voltage from the power source 208 is scaled using a scaling factor, such as that disclosed in U.S. Pat. Nos. 7,257,464 and 8,423,193, which are commonly assigned with the present application and the contents of which are incorporated herein by reference in their entirety. The input voltage can be scaled based on a preset user value. The preset user value is one of maximum voltage output level and maximum power output level, or generally may be current, voltage, or wattage. The current is measured simultaneously with scaling the voltage and providing power to the heater. The scaling comprising a gradual ramp-up to detect heater characteristics during the ramp-up.

In one more form of the present disclosure, the controller 200 determines the desired output voltage of a given power converter 204 based on data from the sensor circuit 238, and on operational state of the heating element, such as heater type, open heater, shorted heater, start-up, warm-up, steadstate, and/or heater temperature. In this example, the controller is configured to operate the power converters to adjust the voltage based on the temperature of the heating elements of the heater such that power from a given power converter matches the change in the temperature of respective heating elements. In another form, the controller switches the control switch at a selected duty cycle, where the duty cycle is determined based on an operation mode of the heating elements. For example, FIGS. 11A to 11D illustrate output voltage waveforms of a power converter that provides power to one or more heating elements of a heater during a start-up mode, a warm-up mode, a steady state mode, and at a disturbance, respectively. As shown, the voltage waveforms applied to the heating elements are different. The voltage varies depending on the resistance of the heating elements, the current flowing through the heating elements, and the temperature of the heating elements. During start-up and warm-up when the temperature is relatively low, the voltage has a relatively small amplitude and thus, the wattage is relatively low. During steady state and disturbance/surge when the temperature is relatively high, the amplitude of the voltage is increased resulting in higher wattage. Additional information regarding such control scheme has been disclosed in Applicant's co-pending provisional application, U.S. Ser. No. 62/543,457, filed Aug. 10, 2017 and titled "System and Method for Controlling Power to a Heater" which is commonly owned with the present application and the contents of which are incorporated herein by reference in its entirety.

By having the power converter system 202, the control system varies the power to the heating elements for a precise and safer control of the heating elements and thus, the heater. For example, lower power may be supplied to one or more heating elements to minimize peak current or may be provided at an early stage of the heating and during shutdown to prevent thermal cracks in the substrate of the heating plate. The controller 200 controls the power converter system 202 to output different voltages and thus, controls the temperature of the individual heating zones. Accordingly, the control system adjusts the temperature differences between different zones to provide uniform temperature throughout the heater of the pedestal.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A support pedestal comprising:
   a substrate having a top resistive layer defining a first set of zones and a bottom resistive layer defining a second set of zones,
   wherein the top resistive layer and the bottom resistive layer are disposed on different planes and are not electrically interconnected to each other with vias extending through the substrate, each zone of the first and second sets of zones is independently controllable, and is coupled to at least two electric terminals from among a plurality of electric terminals configured to supply power to the first and second sets of zones, and a total number of electric terminals is less than or equal to a total of the first and second sets of zones, and
   wherein all of the plurality of electric terminals are disposed at a central region of the substrate, at least one of the first and second sets of zones being connected to said at least one of the plurality of electric terminals at the central region.

2. The support pedestal of claim 1, wherein the plurality of electric terminals are termination pads.

3. The support pedestal of claim 1, wherein at least two zones among the at least one of the first set of zones and the second set of zones are connected to the at least one of the plurality of electric terminals.

4. The support pedestal of claim 1, wherein the support pedestal does not include any routing layers.

5. The support pedestal of claim 1, wherein at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

6. The support pedestal of claim 1 further comprising a control system including a plurality of power converters for adjusting power to each zone of the first and second set of zones of the top and bottom resistive layers.

7. A support pedestal comprising:
   a substrate having a first surface and a second surface opposite the first surface;
   a top resistive layer disposed on the first surface of the substrate and defining a first set of zones;
   a bottom resistive layer disposed on the second surface of the substrate and defining a second set of zones, wherein the top resistive layer and the bottom resistive layer are not electrically interconnected to each other with vias extending through the substrate; and
   a plurality of electric terminals,
   wherein each zone of the first and second sets of zones is independently controllable and coupled to at least two electric terminals from among the plurality of electric terminals configured to supply power to the first and second sets of zones, and a number of electric terminals is less than or equal to a total of the first and second sets of zones, and
   wherein all of the plurality of electric terminals are disposed at a central region of the substrate, at least one of the first and second sets of zones being connected to said at least one of the plurality of electric terminals at the central region.

8. The support pedestal of claim 7, wherein the support pedestal does not include any routing layers.

9. The support pedestal of claim 7, wherein at least two zones among the at least one of the first set of zones and the second set of zones are connected to a same electric terminal among the plurality of electric terminals.

10. The support pedestal of claim 7, wherein at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

11. The support pedestal of claim 7 further comprising a control system including a plurality of power converters for adjusting power to each zone of the first and second set of zones of the top and bottom resistive layers.

12. A support member comprising:
   a top resistive layer having at least two zones;
   a bottom resistive layer disposed in a different plane than that of the top resistive layer, the bottom resistive layer having at least two zones;
   a main substrate disposed between the top and bottom resistive layers, wherein the top resistive layer and the bottom resistive layer are not electrically interconnected to each other with vias extending through the substrate; and
   a plurality of electric terminals configured to supply power to the at least two zones of the top resistive layer and the at least two zones of the bottom resistive layer, wherein at least two electric terminals from among the plurality of electric terminals are disposed on the same plane as at least one of the top resistive layer and the bottom resistive layer,
   wherein each zone of the top and bottom resistive layer is coupled to at least two electric terminals from among the plurality of electric terminals and a number of the electric terminals is less than or equal to a total number of the zones of the top and bottom resistive layers, and
   wherein all of the plurality of electric terminals are disposed at a central region of the support member, at least one of the first and second sets of zones being connected to said at least one of the plurality of electric terminals at the central region.

13. The support member of claim 12, wherein the support member does not include any routing layers.

14. The support member of claim 12, wherein at least one of the top resistive layer and the bottom resistive layer has one or more of a two-wire heater configuration, a matrix wiring configuration for connecting the at least one of the top resistive layer and the bottom resistive layer to an external power source, and a multi-parallel wiring configuration for connecting the at least one of the top resistive layer and the bottom resistive layer to an external power source.

* * * * *